US010993352B2

(12) United States Patent
Bucher

(10) Patent No.: US 10,993,352 B2
(45) Date of Patent: Apr. 27, 2021

(54) THERMAL TRANSFER DEVICE FOR A PLUGGABLE MODULE ASSEMBLY

(71) Applicant: TE CONNECTIVITY CORPORATION, Berwyn, PA (US)

(72) Inventor: Alan Weir Bucher, Manheim, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/242,411

(22) Filed: Jan. 8, 2019

(65) Prior Publication Data
US 2020/0221607 A1    Jul. 9, 2020

(51) Int. Cl.
*H05K 7/20* (2006.01)
*G02B 6/42* (2006.01)
*H01R 12/71* (2011.01)
*H01R 13/66* (2006.01)

(52) U.S. Cl.
CPC ....... *H05K 7/20418* (2013.01); *G02B 6/4261* (2013.01); *G02B 6/4269* (2013.01); *G02B 6/4277* (2013.01); *H01R 12/716* (2013.01); *H01R 13/665* (2013.01); *H01R 13/6658* (2013.01); *H05K 7/2039* (2013.01)

(58) Field of Classification Search
CPC .............. H05K 7/20418; H01R 13/665; H01R 12/716; G02B 6/4261; G02B 6/4269; G02B 6/4277
USPC ........................................ 361/702, 709, 715
See application file for complete search history.

(56) References Cited

U.S. PATENT DOCUMENTS

| 5,052,481 | A | * | 10/1991 | Horvath | ............. H01L 23/4006 |
| | | | | | 165/185 |
| 6,604,575 | B1 | | 8/2003 | Degtiarenko | |
| 6,793,517 | B2 | | 9/2004 | Neer et al. | |
| 8,616,376 | B2 | | 12/2013 | Cronin | |
| 9,389,368 | B1 | * | 7/2016 | Sharf | ...................... H01R 27/00 |
| 9,608,377 | B1 | * | 3/2017 | Phillips | ............. H01R 13/7175 |
| 9,668,379 | B1 | * | 5/2017 | Bucher | ................ H01R 13/514 |
| 9,773,718 | B2 | * | 9/2017 | Douglas | ................ H01L 23/427 |
| 10,617,034 | B2 | * | 4/2020 | Hubahib Gaviola | ........ |
| | | | | | H05K 7/20336 |
| 2004/0001317 | A1 | * | 1/2004 | Getz, Jr. | ............. H01L 23/3672 |
| | | | | | 361/703 |
| 2005/0286232 | A1 | * | 12/2005 | Chen | ..................... H01L 23/467 |
| | | | | | 361/710 |
| 2009/0154103 | A1 | * | 6/2009 | Liu | ........................ H01L 23/467 |
| | | | | | 361/700 |
| 2011/0174468 | A1 | * | 7/2011 | Lu | ............................. G06F 1/20 |
| | | | | | 165/133 |
| 2012/0082420 | A1 | * | 4/2012 | Aoki | .................... H05K 1/0206 |
| | | | | | 385/88 |

(Continued)

*Primary Examiner* — Jayprakash N Gandhi
*Assistant Examiner* — Stephen S Sul

(57) ABSTRACT

A pluggable module assembly includes a housing having a top wall, a bottom wall and sidewalls between the top wall and the bottom wall forming a cavity configured to hold an electrical component therein. The top wall has an opening above the cavity aligned with the electrical component receiving a thermal transfer device that is separate and discrete from the housing. The thermal transfer device transmits heat from the electrical component to fins separated by channels at an upper thermal interface. The upper thermal interface is exposed from above the housing for interfacing with an external heat sink for transferring heat from the thermal transfer device.

17 Claims, 5 Drawing Sheets

(56) References Cited

U.S. PATENT DOCUMENTS

| | | | |
|---|---|---|---|
| 2012/0293952 A1* | 11/2012 | Herring | H01L 23/367 |
| | | | 361/679.54 |
| 2013/0210269 A1 | 8/2013 | Neer et al. | |
| 2014/0151010 A1* | 6/2014 | Nichols | H01L 23/467 |
| | | | 165/185 |
| 2015/0280368 A1* | 10/2015 | Bucher | G02B 6/4269 |
| | | | 439/487 |
| 2016/0211623 A1* | 7/2016 | Sharf | G02B 6/4269 |
| 2016/0211625 A1* | 7/2016 | Sharf | G02B 6/4284 |
| 2017/0094830 A1* | 3/2017 | Bucher | H05K 7/20445 |
| 2017/0168253 A1* | 6/2017 | Wilcox | G02B 6/4277 |
| 2019/0044299 A1* | 2/2019 | Kazav | H05K 7/20163 |
| 2019/0182985 A1* | 6/2019 | Gaviola | H05K 7/20336 |
| 2019/0271818 A1* | 9/2019 | Cabessa | G02B 6/428 |

\* cited by examiner

THERMAL TRANSFER DEVICE FOR A PLUGGABLE MODULE ASSEMBLY

BACKGROUND OF THE INVENTION

The subject matter herein relates generally to a thermal transfer device for a pluggable module assembly.

Electrical connector assemblies allow users of electronic equipment or external devices to transfer data to or communicate with other equipment and devices. Typically, electrical connector assemblies include a pluggable module that is received within a receptacle assembly, which includes a receptacle connector that removably connects to the pluggable module. The receptacle assembly includes a metal cage having an internal compartment that receives the pluggable module therein. The receptacle connector is held in the internal compartment of the cage for connection with the pluggable module as the pluggable module is inserted therein.

Pluggable modules are generally constructed according to established standards for size and compatibility (e.g., Small Form-factor Pluggable (SFP), XFP, Quad Small Form-factor Pluggable (QSFP) or Micro Quad Small Form-factor Pluggable (MicroQSFP)). The XFP, QSFP, and MicroQSFP standards require that the module assemblies be capable of transmitting data at high rates, such as 28 gigabits per second. As the density, power output levels, and signal transmission rates increase, the circuitry within the module assemblies generates larger amounts of heat. The heat generated by the operation of these devices can lead to significant problems. For example, some pluggable modules may lose performance, or outright fail, if the core temperature of the module rises too high.

Known techniques used to control the temperature of individual pluggable modules include the use of heat sinks and heat pipes held by the cage that interface with the pluggable module. For instance, heat dissipation for pluggable modules can be accomplished by the use of a heat sink coupled to the top of the cage. The heat sink includes a planar mating interface that presses against the flat top surface of the shell of the pluggable module to dissipate heat from the shell of the pluggable module. The heat from the electrical component is transferred into the shell of the pluggable module and then transferred from the shell into the heat sink. However, the high thermal resistance of the interface between the heat sink and top surface of the pluggable module significantly limits the rate of heat transfer. Additionally, variations in manufacturing tolerances can result in cumbersome assembly and unreliable thermal contact at the interface between the heat sink and the pluggable module.

Design limitations can limit heat sink interfacing with the pluggable module. For example, typical pluggable module designs are limited by the geometric envelope or outer dimensions of the pluggable module because the pluggable module needs to be loaded into the front opening of the cage. The pluggable module size cannot be increased beyond the dimensions of the front opening to the cage. Accordingly, this limitation can restrict the surface area for interfacing between the heat sink and the pluggable module, thus restricting the ease of heat transfer.

Therefore, there is a need for a thermal transfer device for a pluggable module assembly having improved thermal resistance.

BRIEF DESCRIPTION OF THE INVENTION

In one embodiment, a pluggable module assembly is provided that includes a housing having a top wall, a bottom wall and sidewalls between the top wall and the bottom wall forming a cavity configured to hold an electrical component therein. The top wall has an opening above the cavity aligned with the electrical component. The pluggable module assembly includes a thermal transfer device separate and discrete from the housing received in the opening and extending into the cavity into thermal communication with the electrical component. The thermal transfer device transfers heat from the electrical component to an upper thermal interface. The thermal transfer device includes fins separated by channels at the upper thermal interface such that the upper thermal interface is non-planar. The upper thermal interface is exposed from above the housing for interfacing with an external heat sink for transferring heat from the thermal transfer device.

In a further embodiment, a pluggable module assembly is provided that includes a housing having a top wall, a bottom wall and sidewalls between the top wall and the bottom wall forming a cavity configured to hold an electrical component therein. The top wall has an opening above the cavity aligned with the electrical component. The pluggable module assembly includes a thermal transfer device separate and discrete from the housing received in the opening and extending into the cavity into thermal communication with the electrical component. The thermal transfer device transfers heat from the electrical component to an upper thermal interface. The thermal transfer device includes fins separated by channels at the upper thermal interface such that the upper thermal interface is non-planar. The upper thermal interface is positioned at or below the top wall of the housing.

In another embodiment, a pluggable module assembly is provided that includes a housing having a top wall, a bottom wall and sidewalls between the top wall and the bottom wall forming a cavity configured to hold an electrical component therein. The top wall has an opening above the cavity aligned with the electrical component. The pluggable module assembly includes a thermal transfer device separate and discrete from the housing received in the opening and extending into the cavity into thermal communication with the electrical component. The thermal transfer device includes an upper member defining an upper thermal interface and a lower member having a lower thermal interface configured to interface with the electrical component. The upper member is in thermal communication with the lower member and transferring heat from the lower member to an external heat sink for dissipating heat from the thermal transfer device.

In a further embodiment, a pluggable module assembly is provided including a housing having a top wall, a bottom wall and sidewalls between the top wall and the bottom wall forming a cavity configured to hold an electrical component therein. The top wall has an opening above the cavity aligned with the electrical component. The pluggable module assembly includes a thermal transfer device separate and discrete from the housing received in the opening and extending into the cavity into thermal communication with the electrical component. The thermal transfer device includes an upper member defining an upper thermal interface and a lower member having a lower thermal interface configured to interface with the electrical component. The upper member includes a plurality of upper plates arranged in a stacked arrangement and the lower member includes a plurality of lower plates arranged in a stacked arrangement. The upper plates and the lower plates are interleaved at a thermal transfer device interface. The upper member is in thermal communication with the lower member and transfers heat from the lower member to the upper thermal interface.

DETAILED DESCRIPTION OF THE INVENTION

Embodiments described herein include an electrical connector assembly having a thermal transfer device for a pluggable module assembly, which may have a variety of configurations as set forth herein. For example, the electrical connector assembly may be a Small Form-factor Pluggable (SFP), XFP, Quad Small Form-factor Pluggable (QSFP), Micro Quad Small Form-factor Pluggable (MicroQSFP) connector, and the like. The electrical connector assembly may be used to convey data signals from one electrical device to another, and more particularly to convey data signals at high frequencies, such as at speeds at or above 28 gigabits per second (Gbps). The electrical connector assembly includes a pluggable module assembly having a thermal transfer device in thermal communication with the electrical component that is configured to transfer heat, such as to an interfacing heat sink held by the cage of the electrical connector assembly, and thus to the surrounding environment. The thermal transfer device may have a variety of configurations as set forth herein.

Figure 1:
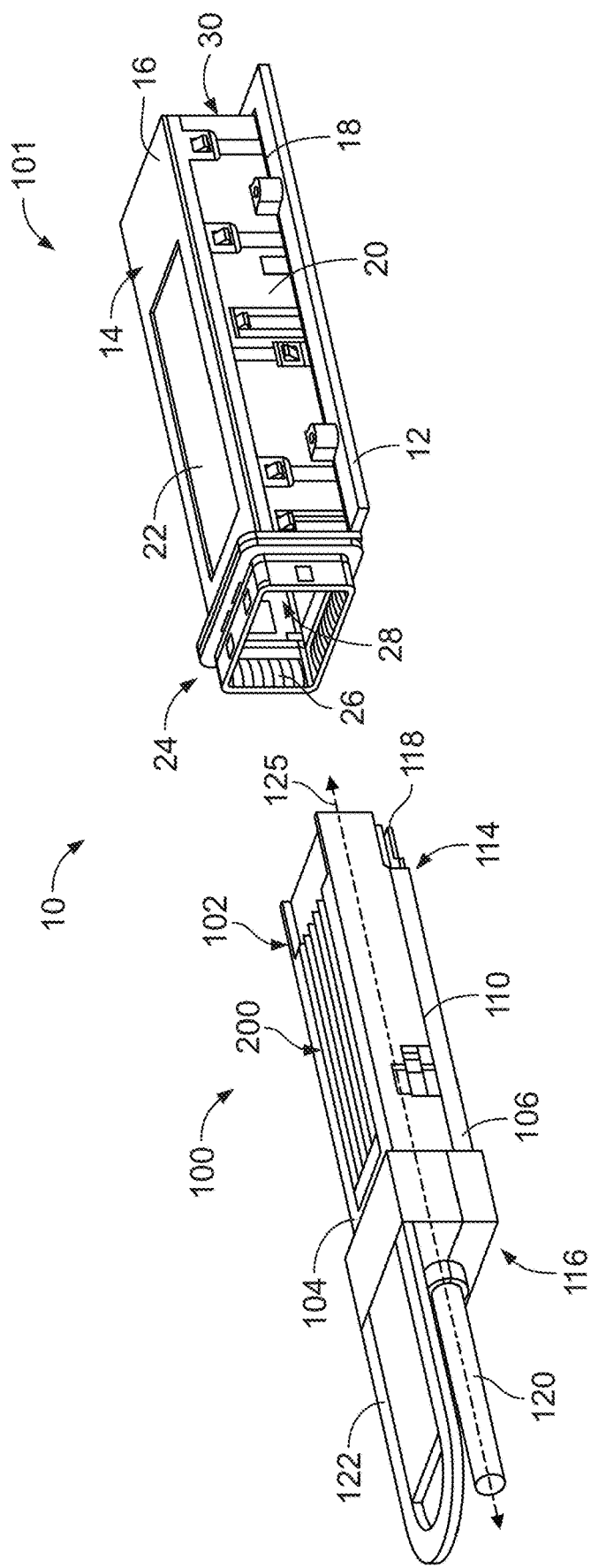
FIG. 1 illustrates a perspective view of an electrical connector assembly in accordance with an embodiment.

FIG. 1 is a perspective view of an electrical connector assembly 10 formed in accordance with an exemplary embodiment. The electrical connector assembly 10 includes one or more pluggable module assemblies 100 configured for pluggable insertion into a receptacle assembly 101 that is mounted to a host circuit board 12. The host circuit board 12 may be mounted in a host system (not shown) such as, but not limited to, a router, a server, a computer, and/or the like. The host system typically includes a conductive chassis (not shown) having a panel (not shown) including one or more openings (not shown) extending therethrough in substantial alignment with the receptacle assembly 101. The receptacle assembly 101 is optionally electrically connected to the panel.

In general, the pluggable module assembly 100 and the receptacle assembly 101 may be used in any application requiring an interface to a host system to transmit electrical and/or optical signals. The pluggable module assembly 100 interfaces to the host system via a receptacle connector (not shown) of the receptacle assembly 101. The receptacle assembly 101 includes the receptacle connector and an electrically conductive cage 14 (which is sometimes referred to as a "receptacle guide frame" or a "guide frame").

The cage 14 includes a plurality of walls forming a cavity. For example, the cage 14 includes an upper wall 16, a lower wall 18, and sidewalls 20 extending therebetween. The cage 14 may include a rear wall. An opening 22 extends through the upper wall 16 of the cage 14 to the cavity. The opening 22 is configured for exposing and/or providing access to a portion of the pluggable module assembly 100, such as a thermal transfer device 200, when the pluggable module assembly 100 is inserted into the receptacle assembly 101. The cage 14 includes a front end 24 having one or more front openings or ports 26 that are open to one or more corresponding internal compartments 28 of the cage 14 that receive the corresponding pluggable module assemblies 100. The front end 24 of the cage 14 is configured to be mounted, or received, within the opening in the panel of the host system. The receptacle connector (not shown) is positioned within the internal compartment 28, such as at a rear end 30 of the cage 14. The internal compartment 28 of the cage 14 receives the pluggable module assembly 100 therein for electrical connection with the receptacle connector. The cage 14 may include any number of internal compartments 28 and ports 26, arranged in any pattern, configuration, arrangement, and/or the like (such as, but not limited to, any number of rows and/or columns), for electrically connecting any number of pluggable module assemblies 100 to the host circuit board. For example, the cage 14 may include multiple stacked or ganged ports 26 and corresponding compartments 28 for receiving multiple pluggable module assemblies 100.

The pluggable module assembly 100 includes a housing 102. Optionally, the housing 102 may be formed from two housing shells, an upper shell 104 and a lower shell 106, which mate or engage with each other along an interface 110, only a portion of which is shown in FIG. 1. The pluggable module assembly 100 has a front end 114, a rear end 116, and a cavity 108 (FIG. 3) that extends lengthwise from the front end 114 to the rear end 116. The front end 114 is configured for pluggable insertion into the receptacle assembly 101 and thus defines a mating end of the pluggable module assembly 100. The front end 114 includes an electrical component 118, which is illustrated in FIG. 1 as a circuit board and may be referred to hereinafter as circuit board 118; however, other types of electrical components 118 may be held by the housing 102. The circuit board 118 is configured to couple with the electronic system or device through the receptacle connector in order to establish an electrical connection.

The pluggable module assembly 100 may include a cable 120 that extends into the cavity 108 from the rear end 116 and connects with the circuit board 118 within the housing 102. When in operation, the pluggable module assembly 100 may transmit data signals through the cable 120. Optionally, the pluggable module assembly 100 may include a tab 122 that couples to the rear end 116 and facilitates gripping and removing the pluggable module assembly 100 from the receptacle assembly 101. For example, the tab 122 may be coupled to a pair of slidable actuators (not shown) that include ejector latches (not shown) that engage sides of the receptacle assembly 101, such as the cage 14, to latchably secure the pluggable module assembly 100 in the internal compartment 28.

Figure 2:
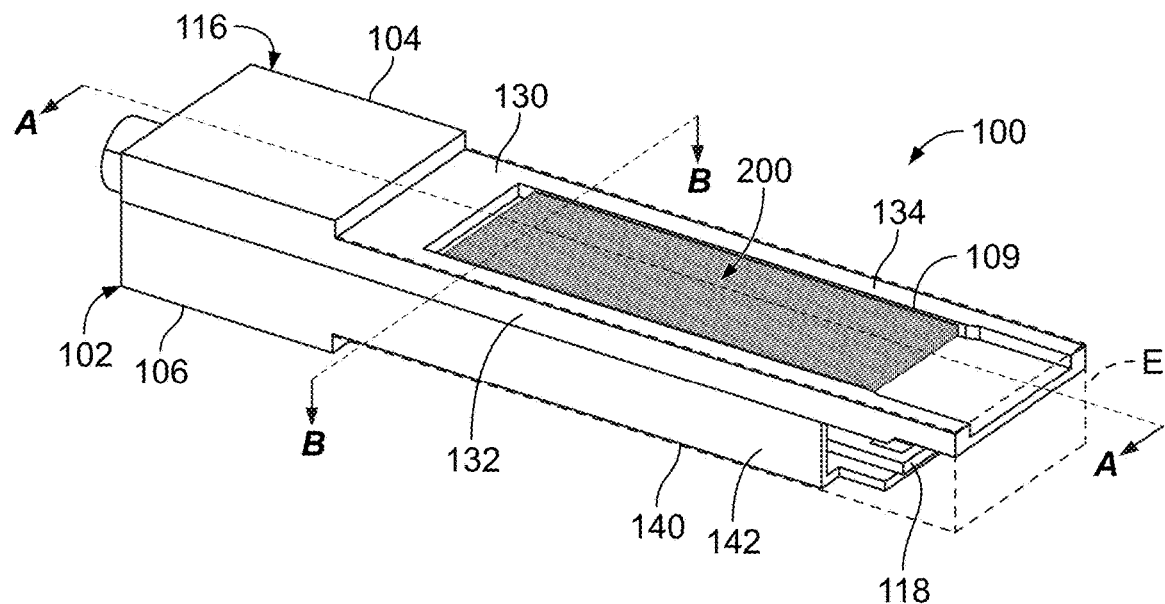
FIG. 2 illustrates a perspective view of a pluggable module assembly in accordance with an embodiment.

FIG. 2 is a perspective view of the pluggable module assembly 100 formed in accordance with an embodiment. The pluggable module assembly 100 includes the thermal transfer device 200 in thermal communication with the electrical component 118. The thermal transfer device 200 is configured to transfer heat from the pluggable module assembly 100, such as to an external heat sink and/or to the surrounding environment.

The housing 102 includes opposing endwalls and opposing sidewalls forming the cavity 108. For example, in the illustrated embodiment, the housing 102 includes a top wall 130 defined by the upper shell 104 and a bottom wall 140 defined by the lower shell 106. The housing 102 includes sidewalls defined by the upper shell 104 and/or the lower shell 106. For example, the sidewalls may be defined by sidewalls 132, 134 of the upper shell 104 and sidewalls 142, 144 of the lower shell 106. The walls define the cavity 108. The electrical component 118 is received in the cavity 108 between the upper shell 104 and lower shell 106. The upper shell 104 and/or the lower shell 106 may have other shapes in alternative embodiments.

In an exemplary embodiment, the thermal transfer device 200 extends into the cavity 108 through an opening 109 in the upper shell 104 to thermally couple with the circuit board 118. In various embodiments, the thermal transfer device 200 directly engages the circuit board 118 and/or various components on the circuit board 118, to transfer heat directly from the electrical component 118. Heat generated by the pluggable module assembly 100, such as by the components on the circuit board 118, is transferred by the thermal transfer device 200 via the thermal connection between the thermal transfer device 200 and the electrical component 118.

In an exemplary embodiment, the thermal transfer device 200 does not exceed or extend beyond an envelope E of the pluggable module assembly 100 so that the thermal transfer device 200 does not increase the overall dimensions of the front end 114 of the pluggable module assembly 100. As such, the thermal transfer device 200 does not impair loading or unloading of the pluggable module assembly 100 into or out of the cage 14. The envelope E of the pluggable module assembly 100 is defined as the three-dimensional area determined by the maximum dimensions of height, length, and width of the front end 114 of the housing 102 of the pluggable module assembly 100. As shown in FIG. 2, the envelope E is a generally rectangular prism represented by the dotted line (E) and defined by the maximum height, width and length dimensions of the front end 114 of the housing 102.

Figure 3:
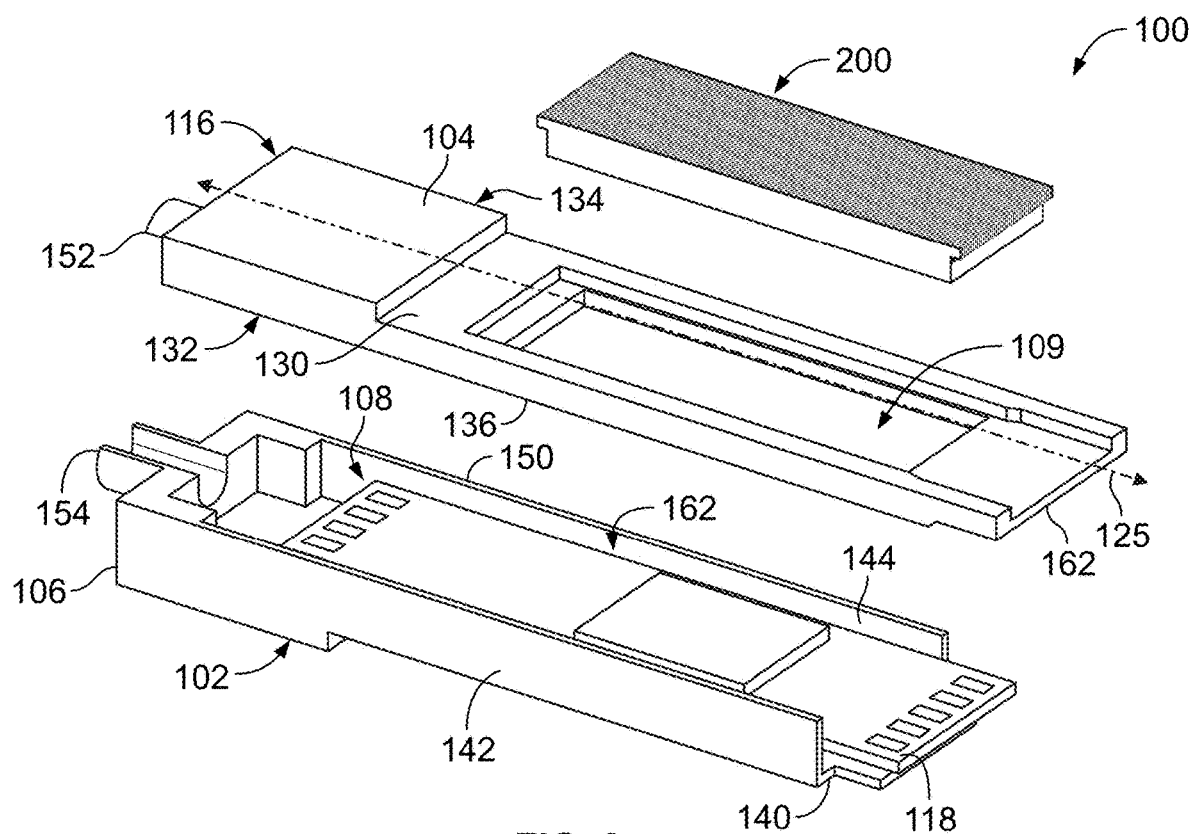
FIG. 3 is an exploded perspective view of the pluggable module assembly in accordance with an embodiment.

FIG. 3 is an exploded perspective view of the pluggable module assembly 100 before the upper and lower shells 104 and 106 are mated with each other to form the pluggable module assembly 100. The upper and lower shells 104 and 106 may have a generally open-faced rectangular shape. The upper shell 104 includes the top wall 130 and the opposing sidewalls 132 and 134. In FIG. 3, the opposing sidewalls 132 and 134 form planes that are parallel with respect to each other and extend parallel to the longitudinal axis 125. However, alternative embodiments may include sidewalls 132 and 134 that are not parallel and do not oppose each other. The inner surfaces of the top wall 130 and the sidewalls 132 and 134 form a shell interior surface (not shown) defining an upper portion of the cavity 108, which may be used to support and/or position the circuit board 118 in the cavity 108. The sidewalls 132, 134 extend to lower edges 136 that face the lower shell 106. The lower shell 106 includes the bottom wall 140 and the opposing sidewalls 142 and 144. The inner surfaces of the sidewalls 142 and 144 and the interior wall 140 define an interior surface 162 forming a lower portion of the cavity 108, which may be used to support and/or position the circuit board 118 in the cavity 108. The sidewalls 142, 144 extend to upper edges 150 that may be similarly shaped to the lower edges 136 and also generally extend parallel to or along the longitudinal axis 125. When the pluggable module assembly 100 is formed, the upper shell 104 is lowered onto the lower shell 106 such that the upper edges 150 and lower edges 136 seat against each other.

Also shown in FIG. 3, the upper and lower shells 104 and 106 each include a semi-circular cable extension 152 and 154, respectively, which projects from the rear end 116 of the respective shell. When the cable extensions 152 and 154 are joined together, the cable extensions 152 and 154 form a strain-relief extension that includes an opening (not shown) for receiving the cable 120.

Although the interior surface 162 has a rectangular shape in FIG. 3, the interior surface 162 may have other shapes or configurations. For example, the interior wall 140 may be semi-circular (concave or convex) or shaped like a trough instead of being substantially planar. Also, the sidewalls 142 and 144 may form a non-orthogonal angle with respect to the interior wall 140 instead of a perpendicular angle as shown in FIG. 3.

In various embodiments, the upper and lower shells 104 and 106 may be cast, stamped, drawn, molded, or otherwise formed for mating together. In other various embodiments, the housing 102 may be formed from a single piece rather than the multiple shells 104, 106. The housing 102 is manufactured from a material that limits or prevents the transmission of EMI and/or electromagnetic radiation through the housing 102. For example, the upper and lower shells 104 and 106 may be manufactured from a metal material. The upper and lower shells 104, 106 may be manufactured from a material having high electromagnetic radiation absorbing characteristics, such as, a low magnetic permeability factor or a low electric permittivity factor. The upper and lower shells 104 and 106 may be made from a metal material such as, but not limited to stainless steel, copper, aluminum, zinc, alloys, and the like. The upper and lower shells may be manufactured from composite materials. Optionally, the material may be a conductive impregnated dielectric material that dissipates substantially all of the electromagnetic radiation by reflecting, scattering, and/or diffusing the electromagnetic radiation.

The thermal transfer device 200 is separate and discrete from the housing 102. For example, the thermal transfer device 200 may be separately manufactured and received in the housing 102, such as in the upper shell 104. The thermal transfer device 200 may be manufactured from a different material than the housing 102, such as from a highly thermally conductive material. For example, the thermal transfer device 200 may be manufactured from copper or aluminum.

In an exemplary embodiment, the thermal transfer device 200 is a single piece device, such as a metal block; however, the thermal transfer device 200 may be manufactured as a multi-piece device in alternative embodiments. The thermal transfer device 200 is configured to be in thermal communication with the circuit board 118 for dissipation of heat from the circuit board 118 and/or one or more components associated with the circuit board 118. For example, the thermal transfer device 200 may be coupled directly to the circuit board 118 and/or the components on the circuit board 118. The thermal transfer device 200 is also configured to be in thermal communication with an external heat sink held by the cage 14 to dissipate heat from the thermal transfer device 200.

FIG. 3 illustrates the thermal transfer device 200 as a solid block; however, it is realized that the thermal transfer device 200 may include a plurality of plates arranged in a stacked arrangement rather than a solid block. FIG. 3 illustrates the thermal transfer device 200 as having a smooth interface (for example, a flat surface); however, it is realized that the thermal transfer device 200 may include a stepped interface, such as for interfacing with the components on the circuit board or a having other features, such as heat transferring elements. In an exemplary embodiment, the thermal transfer device 200 includes heat transfer fins extending from the upper surface.

Figure 4:
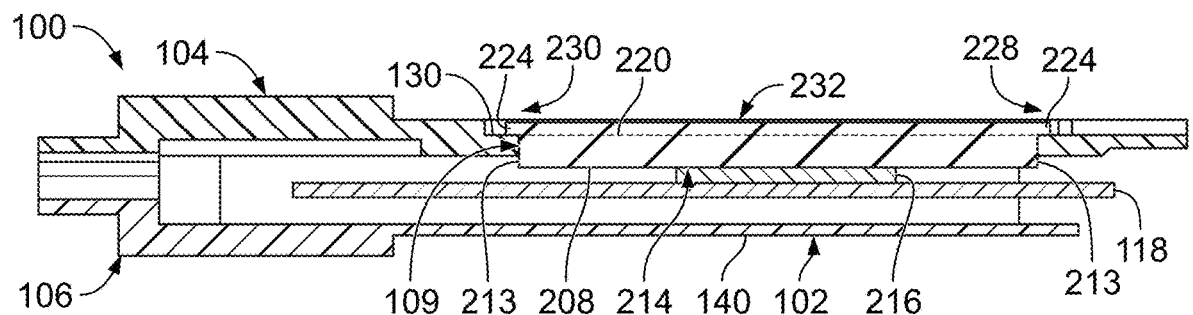
FIG. 4 is a cross-section view of the pluggable module assembly taken along A-A shown in FIG. 2 formed in accordance with an embodiment.
Figure 5:
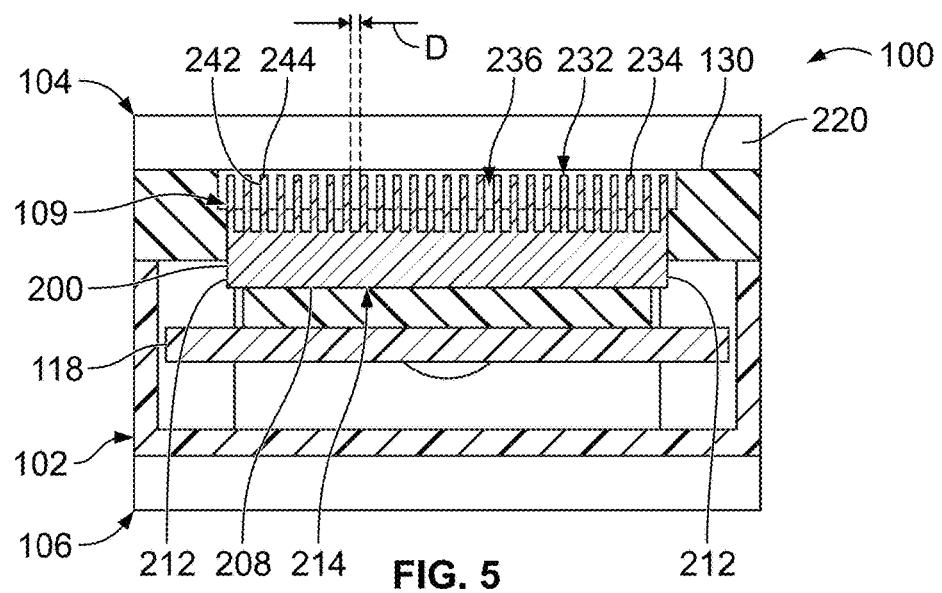
FIG. 5 is a cross-section view of the pluggable module assembly taken along B-B shown in FIG. 2 formed in accordance with an embodiment.

FIG. 4 is a cross-section view of the pluggable module assembly taken along A-A shown in FIG. 2 formed in accordance with an embodiment. FIG. 5 is a cross-section view of the pluggable module assembly taken along B-B shown in FIG. 2 formed in accordance with an embodiment. When assembled, the thermal transfer device 200 is in thermal communication with the electrical component 118 to transfer heat.

The thermal transfer device 200 includes a lower wall 208, an upper wall 210, opposing sidewalls 212 and opposing endwalls 213 extending therebetween. The thermal transfer device 200 has a front end 228 and a rear end 230 (FIG. 4) and the endwalls 213 are provided at the front and rear ends 228, 230. The opposing sidewalls 212 form planes that are parallel with respect to each other and extend parallel to the longitudinal axis 125 (FIG. 3). However, alternate embodiments may include sidewalls 212 that are not parallel and do not oppose each other. The opposing endwalls 213 (FIG. 4) form planes that are parallel with respect to each other and extend perpendicular to the longitudinal axis 125. However, alternate embodiments may include endwalls 213 that are not perpendicular and do not oppose each other.

The lower wall 208 defines a thermal interface 214 configured to mate or engage with the circuit board 118 and/or a component on the circuit board 118. Optionally, thermal interface material may be positioned along the lower thermal interface 214 to increase thermal transfer efficiency between the electrical component 118 and the thermal transfer device 200. For example, the thermal interface material may include thermally conductive tape, a thermal paste, a grease, an oil, a silicone material, a phase change material, and the like.

In an exemplary embodiment, the endwalls 213 of the thermal transfer device 200 include lips 224, such as at the upper wall 210. The lips 224 extend beyond the endwalls 213 of the thermal transfer device 200. The lips 224 are used to mate or seat the thermal transfer device 200 on the top wall 130 of the housing 102 at each end of the opening 109 of the upper shell 104 for positioning the thermal transfer device 200 with respect to the housing 102.

The thermal transfer device 200 includes an upper thermal interface 232 at the upper wall 210 of the thermal transfer device 200. The upper thermal interface 232 is used for transferring heat from the thermal transfer device 200, such as into air around the thermal transfer device 200 or into another component. For example, the upper thermal interface 232 may be configured for interfacing with an external heat sink 300 (FIG. 6), such as one held by the cage 14. In an exemplary embodiment, the thermal transfer device 200 includes a plurality of heat transferring elements 234 at the upper thermal interface 232. In an exemplary embodiment, the heat transferring elements 234 are defined by fins and may be referred to hereinafter as heat transfer fins 234 or, simply, fins 234. The heat transferring elements 234 are configured to increase the effective surface area for thermal communication with the external heat sink, or to air, and thus increase the rate of heat transfer to the heat sink.

In an exemplary embodiment, the upper thermal interface 232 is positioned at or below the top wall 130 of the housing 102. For example, distal ends of the fins 234 are at or below the top wall 130. As such, the fins 234 are arranged within the envelope E of the housing 102 defined by the height of the housing 102 between the top wall 130 and the bottom wall 140 and the width of the housing 102 between the sidewalls 132, 134. The thermal transfer device 200 is contained within the envelope E and does not extend beyond the height or the width of the housing 102.

In an exemplary embodiment, the heat dissipating fins 234 are defined by an array of longitudinal arranged fins 234 extending from the upper wall 210 of the thermal transfer device 200 parallel with the longitudinal axis 125. The fins 234 are separated by channels 236. The channels 236 extend parallel to the longitudinal axis 125. In the illustrated embodiment, the thermal transfer device 200 defines heat dissipating elements 234 evenly spaced apart at a distance D and defining the channels 236 therebetween. The channels 236 have a width equal to the distance D. Optionally, the distance D may be approximately equal to the thickness of the fins 234. The heat dissipating elements 234 may have other configurations, arrangements, and/or patterns, including any number of rows or columns in alternative embodiments.

At the upper wall 210, for embodiments having the fins 234, the side surfaces 242 face the channels 236. The channels 236 are configured to receive fins of the external heat sink 300. The side surfaces 242 are configured to be in thermal communication with the external heat sink 300 when the external heat sink 300 is coupled thereto. For example, fins of the external heat sink 300 are configured to be located between corresponding fins 234 and likewise the fins 234 are configured to be located between corresponding fins of the external heat sink 300 such that the side surfaces 242 are in thermal communication with the fins of the external heat sink 300. The end edges 244 may be used to position or support the external heat sink 300.

Optionally, the thermal transfer device 200 may be formed from a material that limits or prevents the transmission of EMI and/or electromagnetic radiation from the pluggable module assembly 100. For example, the thermal transfer device 200 may be manufactured from a material having high electromagnetic radiation absorbing characteristics. In alternate embodiments, the thermal transfer device 200 may be secured to the pluggable module assembly using one or more retaining members. For example, the retaining members may include other structure to secure the thermal transfer device 200, including but not limited to adhesive, push pins, fasteners, tape, a latch, a clip, and the like.

Figure 6:
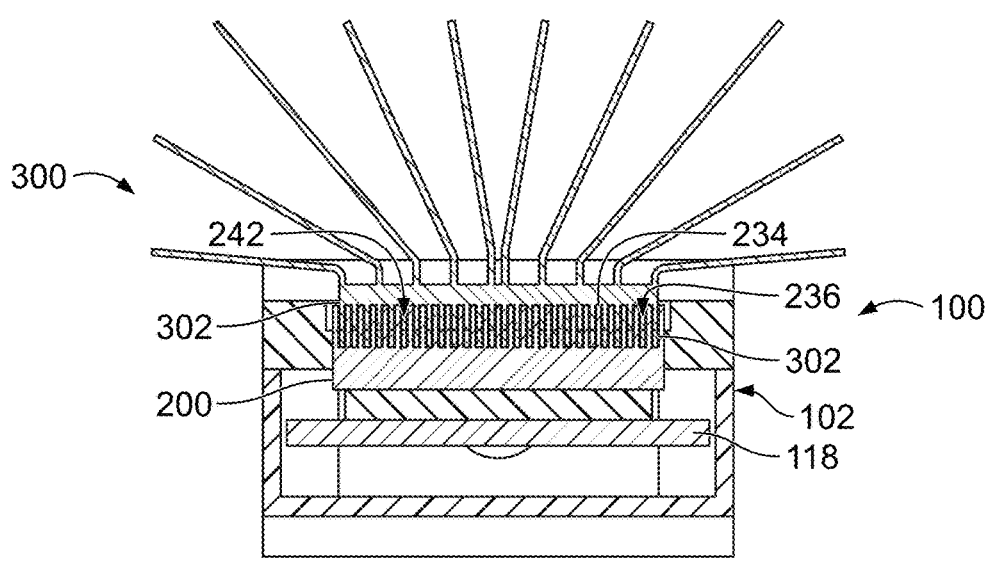
FIG. 6 is a cross-section view of the pluggable module assembly coupled with an external heat sink formed in accordance with an embodiment.

FIG. 6 is a cross-section view of the pluggable module assembly coupled with the external heat sink 300 in accordance with an embodiment. The heat dissipating elements 234 are configured to be in thermal communication with the external heat sink 300 when the external heat sink 300 is coupled to the pluggable module assembly 100. Heat generated by the pluggable module assembly 100, such as by the circuit board 118, is transferred or dissipated by the thermal transfer device 200 to the surrounding environment via the heat sink 300. The heat generated by the electrical component 118 is transferred to the heat sink 300 by the thermal transfer device 200 rather than by the housing 102. The thermal transfer device 200 may be designed for efficient heat transfer independent of design considerations for the housing 102. For example, the material selected for the thermal transfer device 200 may be selected for efficient heat transfer and the housing 102 may be manufactured from an appropriate material without focus on the heat transfer because the heat transfer is accomplished using the separate thermal transfer device 200.

In an exemplary embodiment, the external heat sink 300 may include an array of longitudinal fins 302 configured to be received in corresponding channels 236 between associated fins 234. The fins 234 are arranged in thermal communication with the fins 302. The fins 234, 302 are arranged in an interleaved arrangement. Channels are formed between the fins 302 and the channels receive corresponding fins 234. Similarly, the channels 236 receive corresponding fins 302. The side surfaces 242 face the fins 302 and are in thermal communication with the side surfaces of the fins 302. The finned design of the thermal transfer device 200 and the external heat sink 300 effectively increases the surface area of the thermal transfer device 200 and the external heat sink 300 for transfer of heat between the thermal transfer device 200 and the external heat sink 300.

Figure 7:
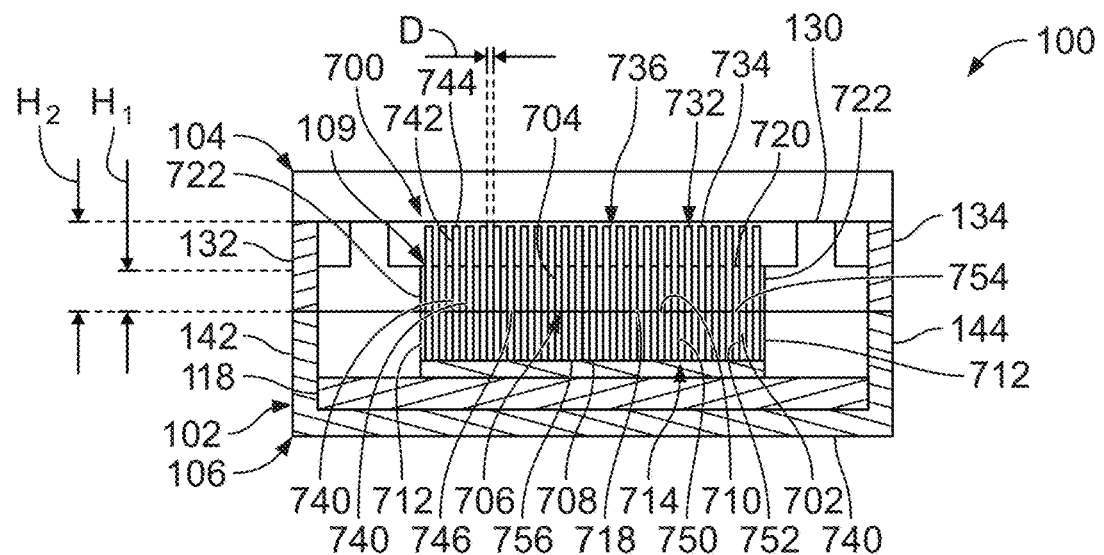
FIG. 7 is a cross-section view of the pluggable module assembly having a thermal transfer device formed in accordance with an exemplary embodiment.
Figure 8:
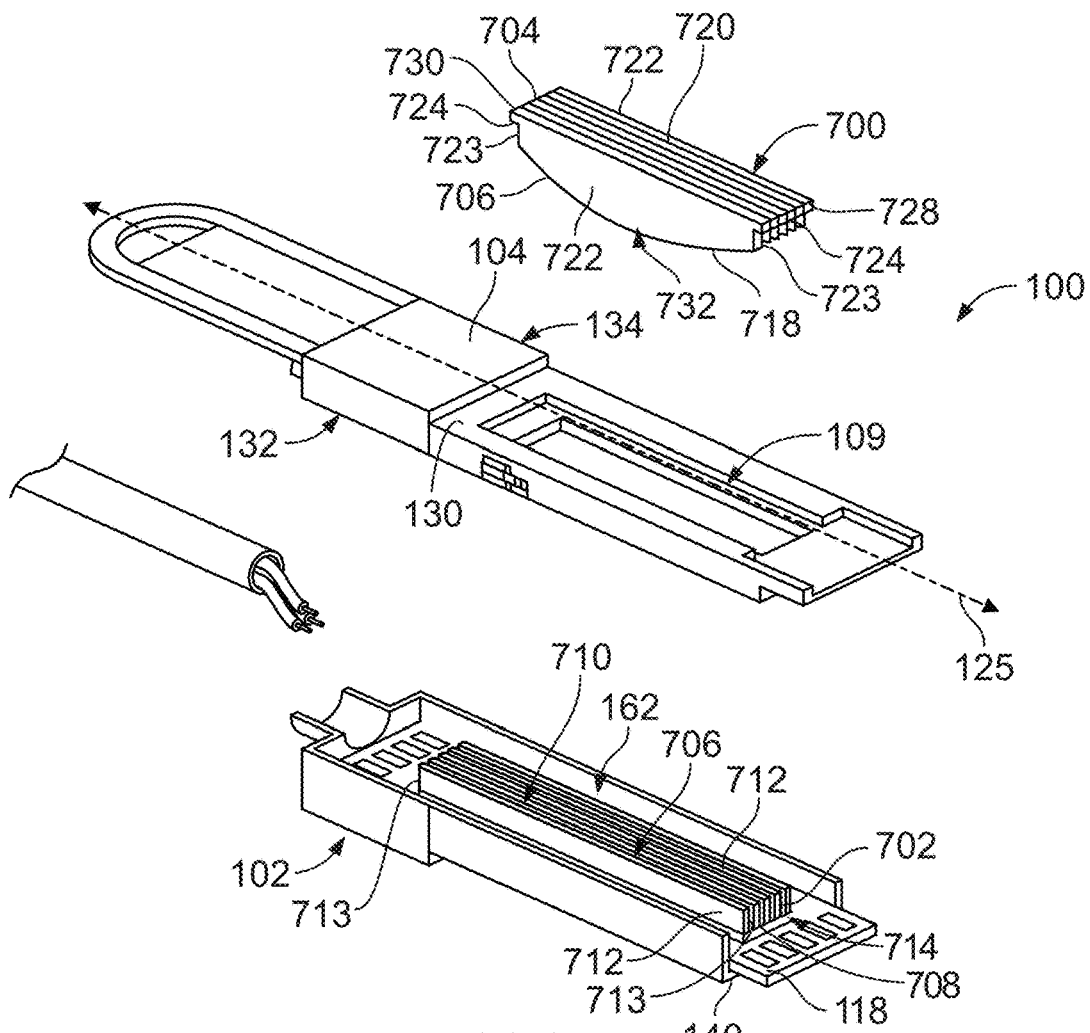
FIG. 8 is an exploded view of the pluggable module assembly in accordance with an exemplary embodiment.
Figure 9:
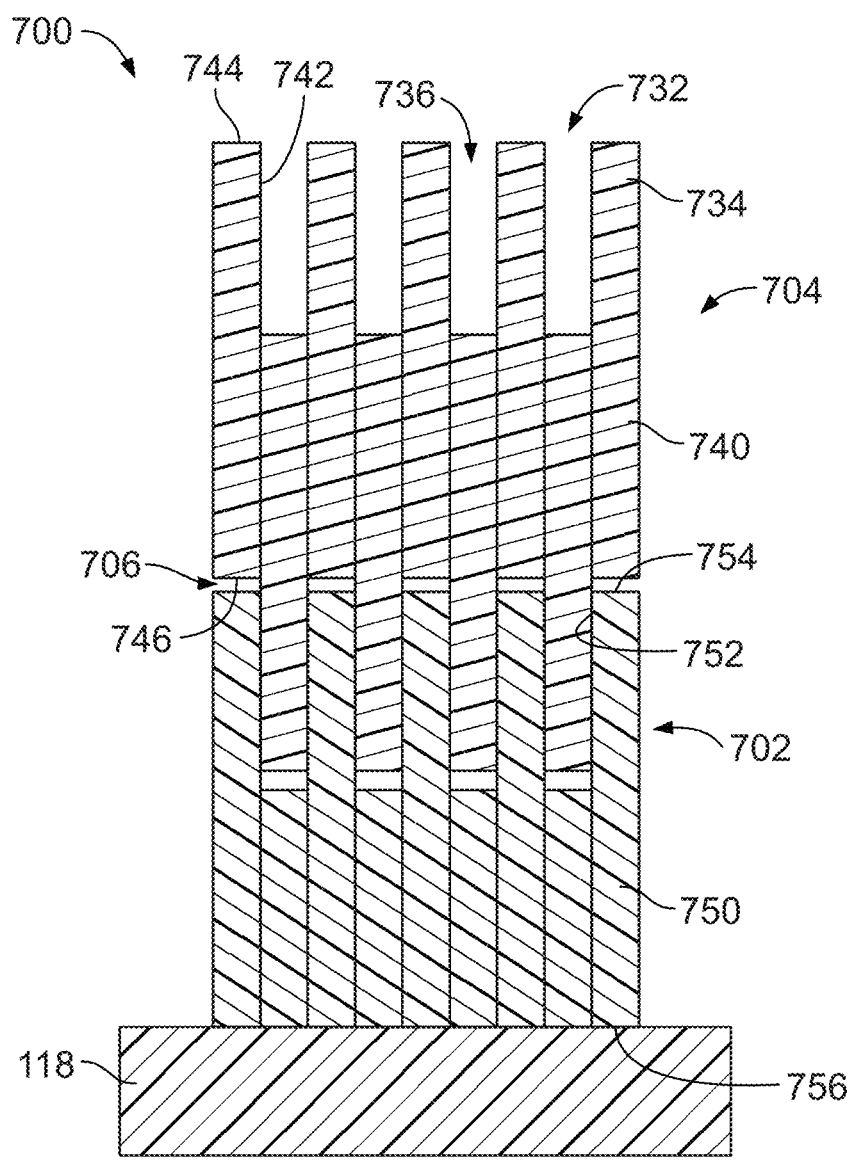
FIG. 9 illustrates a portion of the thermal transfer device 700 in accordance with an exemplary embodiment.

FIG. 7 is a cross-section view of the pluggable module assembly 100 formed in accordance with an alternative embodiment having a thermal transfer device 700. FIG. 8 is an exploded view of the pluggable module assembly 100 having the thermal transfer device 700. FIG. 9 illustrates a portion of the thermal transfer device 700 in accordance with an exemplary embodiment. The thermal transfer device 700 may be similar to the thermal transfer device 200 (FIG. 2), however, in the illustrated embodiment, the thermal transfer device 700 is a multi-piece device. The thermal transfer device 700 includes a lower member 702 and an upper member 704. The thermal transfer device 700 includes multiple plates stacked side-by-side and configured to be interleaved or internested as the upper member 704 and the lower member 702 are mated (FIG. 9). The thermal transfer device 700 is configured to be in thermal communication with the electrical component 118. The thermal transfer device 700 is configured to transfer heat from the electrical component 118, such as to an external heat sink and/or to the surrounding environment.

The thermal transfer device 700 includes a lower member 702 and an upper member 704 that mate or engage with each other along a thermal transfer interface 706 to form the thermal transfer device 700. The lower member 702 is configured to be in thermal communication with the circuit board 118, or a component associated therewith, for dissipation of heat from the circuit board 118. For example, the lower member 702 may be coupled directly to the circuit board 118. The upper member 704 is configured to be in thermal communication with the lower member 702 to transfer heat from the lower member 702. The upper member 704 may be configured to be in thermal communication with an external heat sink held by the cage 114 (FIG. 1) to dissipate heat from the thermal transfer device 700.

The lower member 702 includes a lower wall 708, an upper region 710, opposing sidewalls 712 and opposing endwalls 713 (FIG. 8) extending therebetween. The opposing sidewalls 712 form planes that are parallel with respect to each other and extend parallel to the longitudinal axis 125. However, alternate embodiments may include sidewalls 712 that are not parallel and do not oppose each other. The opposing endwalls 713 form planes that are parallel with respect to each other and extend perpendicular to the longitudinal axis 125. However, alternate embodiments may include endwalls 713 that are not perpendicular and do not oppose each other.

The lower wall 708 defines a lower thermal interface 714 configured to mate or engage with the circuit board 118 and/or a component on the circuit board 118. Optionally, thermal interface material may be positioned along the lower thermal interface 714 to increase thermal transfer efficiency between the electrical component 118 and the lower member 702. For example, the thermal interface material may include thermally conductive tape, a thermal paste, a grease, an oil, a silicone material, a phase change material, and the like.

The upper region 710 is configured to engage or mate with the upper member 704. In an exemplary embodiment, the upper region 710 includes fins having end surfaces that are substantially concave along the thermal transfer interface 706. However, the upper region 710 may include end surfaces having other shapes in alternative embodiments, such as being substantially planar.

The upper member 704 includes a lower region 718, an upper wall 720, opposing sidewalls 722 and opposing endwalls 723 (FIG. 8) extending therebetween. The opposing sidewalls 722 form planes that are parallel with respect to each other and extend parallel to the transmission axis 125. However, alternate embodiments may include sidewalls 722 that are not parallel and do not oppose each other. The opposing endwalls 723 form planes that are parallel with respect to each other and extend perpendicular to the transmission axis 125. However, alternate embodiments may include endwalls 723 that are not perpendicular and do not oppose each other.

The lower region 718 is configured to engage or otherwise interface with the upper region 710 of the lower member 702 along the thermal transfer interface 706. In an exemplary embodiment, the lower region 718 includes fins having end surfaces that are substantially convex along the transmission axis 125 for mating with the corresponding substantially concave surfaces of the upper region 710 of the lower member 702. However, the lower region 718 may include end surfaces having other shapes in alternative embodiments, such as being substantially planar.

In an exemplary embodiment, the endwalls 723 of the upper member 704 may include lips 724 (FIG. 8), such as at the upper wall 720. The lips 724 extend beyond the endwalls 713 of the lower member 702. The lips 724 are used to mate or seat the upper member 704 on the top wall 130 of the housing 102 at each end of the opening 109 of the upper shell 104 for positioning the thermal transfer device 700 with respect to the housing 102.

The upper member 704 includes an upper thermal interface 732 at the upper wall 720 of the upper member 704. The upper thermal interface 732 may be configured for interfacing with an external heat sink, such as one held by the cage 14, or may be exposed to air to transfer heat into the surrounding air. In an exemplary embodiment, the upper member 704 includes a plurality of heat transferring elements 734 (FIG. 7) at the upper thermal interface 732. In an exemplary embodiment, the heat transferring elements 734 are defined by fins and may be referred to hereinafter as heat dissipating fins 734 or, simply, fins 734. The heat transferring elements 734 are configured to increase the effective surface area for thermal communication with the external heat sink, and thus increase the rate of heat transfer to the heat sink.

In an exemplary embodiment, the upper thermal interface 732 is positioned at or below the top wall 130 of the housing 102. For example, distal ends of the fins 734 are at or below the top wall 130. As such, the fins 734 are arranged within the envelope E of the housing 102 defined by the height of the housing 102 between the top wall 130 and the bottom wall 140 and the width of the housing 102 between the sidewalls 132, 134. The thermal transfer device 700 is contained within the envelope E and does not extend beyond the height or the width of the housing 102.

In an exemplary embodiment, the heat transfer fins 734 are defined by an array of longitudinal arranged fins 734 extending from the upper wall 720 of the upper member 704 parallel with the transmission axis 125. The fins 734 are separated by channels 736 (FIG. 7). The channels 736 extend parallel to the longitudinal axis 125. In the illustrated embodiment, the upper member 704 defines twenty (20) heat transfer elements 734 evenly spaced apart at a distance D (FIG. 7) and defining the channels 736 therebetween. The channels 736 have a width equal to the distance D. Optionally, the distance D may be approximately equal to the thickness of the fins 734. The heat transferring elements 734 may have other configurations, arrangements, and/or patterns, including any number of rows or columns in alternative embodiments. The fins 734 may be posts, such as circular or rectangular shaped posts, rather than longitudinal fins in alternative embodiments.

The upper member 704 includes fins 734 along the lower interface 718 for interfacing with the lower member 702. For example, the lower member 702 includes a complementary array of fins along the upper region 710 of the lower member 702 that are interleaved with the fins along the lower region 718. Having fins on the upper region 710 and the lowerregion 718 at the thermal transfer interface 706 increases the surface area of the lower member 702 and the upper member 704 interfacing to enhance thermal transfer between the lower member 702 and the upper member 704, where motion is required between the upper member 704 and lower member 702.

In an exemplary embodiment, the upper member 704 is formed by a plurality of plates 740 (FIGS. 7 and 9) arranged in a stacked configuration. For example, the plurality of plates 740 is arranged vertically in a plate stack to form the upper member 704. Optionally, the plates 740 may have different heights to form the fins 734 along the upper wall 720 and/or the lower wall 718. Alternatively, the plates 740 may have equal heights but with adjacent plates 740 being offset to form the fins 734 at the upper wall 720 and at the lower wall 718. The plates 740 are arranged to form the fins 734 and the channels 736. For example, the alternating vertical plates 740 have two different heights $H_1$ (FIG. 7) and $H_2$ (FIG. 7) at the upper wall 720 to form the fins 734 for interfacing with the external heat sink. The plates 740 having the height $H_2$ form the heat dissipating elements 734. With the fins 234, the upper thermal interface 232 is non-planar.

The plates 740 have side surfaces 742, upper end edges 744 and lower end edges 746. The side surfaces 742 face adjacent plates 740. Within the main body of the upper member 704, the side surfaces 742 of adjacent plates 740 engage each other to thermally couple the plates 740 together. The side surfaces 742 may be welded, adhered or otherwise coupled to each other. At the upper wall 720, for embodiments having the fins 734, the side surfaces 742 face the channels 736. The channels 736 are configured to receive fins of the external heat sink. The side surfaces 742 are configured to be in thermal communication with the external heat sink when the external heat sink is coupled thereto.

In various embodiments, the lower member 702 is formed by a plurality of plates 750 (FIGS. 7 and 9) arranged in a stacked configuration. For example, the plurality of plates 750 is arranged vertically in a plate stack to form the lower member 702. The plates 750 may have different heights to form fins along the upper region 710 for interfacing with corresponding fins at the lower region 718 of the upper member 704.

The plates 750 have side surfaces 752, upper end edges 754 and lower end edges 756. The side surfaces 752 face adjacent plates 750. Within the main body of the lower member 702, the side surfaces 752 of adjacent plates 750 engage each other to thermally couple the plates 750 together. The side surfaces 752 may be welded, adhered or otherwise coupled to each other. At the upper region 710 the side surfaces 752 may face channels configured to receive fins at the lower region 718 of the upper member 704. As such, the side surfaces 742 of the upper plates 740 face side surfaces 752 of corresponding adjacent lower plates 750 for thermal transfer between the upper plates 740 and the lower plates 750. The upper end edges 754 may be used to position or support the upper member 704 on the top of the lower member 702. The upper end edges 754 may directly engage the upper member 704, such as corresponding lower end edges 746 of the upper plates 740. The lower end edges 756 may be in thermal communication with the electrical component 118 and/or the thermal interface material at the electrical component 118. Having the upper member 704 and the lower member 702 allows freedom of movement between the external thermal interface 732 and the lower thermal interface 714.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:
1. A pluggable module assembly comprising:
a housing having a top wall, a bottom wall and sidewalls between the top wall and the bottom wall, the housing forming a cavity holding a module circuit board therein, the module circuit board having an electrical component mounted to a surface of the module circuit board, the top wall having an opening above the cavity aligned with the electrical component mounted to the module circuit board; and a thermal transfer device separate and discrete from the housing, the thermal transfer device being received in the opening of the top wall and extending into the cavity of the housing into direct thermal communication with the electrical component mounted to the module circuit board, wherein the thermal transfer device transfers heat from the electrical component mounted to the module circuit board to an upper thermal interface, the thermal transfer device including fins separated by channels at the upper thermal interface such that the upper thermal interface is non-planar, the upper thermal interface being exposed from above the housing for interfacing with an external heat sink for transferring heat from the thermal transfer device, wherein the thermal transfer device includes an upper member defining the upper thermal interface and a lower member having a lower thermal interface configured to interface with the electrical component mounted to the module circuit board, the upper member being in thermal communication with the lower member and transferring heat from the lower member to the external heat sink, and wherein the upper member includes a plurality of upper plates arranged in a stacked arrangement, the upper plates forming the fins, the lower member including a plurality of lower plates arranged in a stacked arrangement, the upper plates and the lower plates being interleaved at a thermal transfer device interface.

2. The pluggable module assembly of claim 1, wherein the housing defines an envelope characterized by a height of the housing between the top wall and the bottom wall and a width of the housing between the sidewalls, wherein the thermal transfer device is contained within the envelope and does not extend beyond the height or the width of the housing.

3. The pluggable module assembly of claim 1, wherein the fins include side surfaces and end edges, the side surfaces facing the channels, the channels configured to receive fins of the external heat sink and the fins of the thermal transfer device are configured to be located between corresponding fins of the external heat sink such that the side surfaces are in thermal communication with the fins of the external heat sink.

4. The pluggable module assembly of claim 1, wherein the upper thermal interface is positioned at or below the top wall of the housing.

5. The pluggable module assembly of claim 1, wherein the housing includes an upper shell and a lower shell, the upper shell defining the top wall, the lower shell defining the bottom wall, the electrical component mounted to the module circuit board being held between the upper shell and the lower shell, the thermal transfer device being received in and held by the upper shell.

6. The pluggable module assembly of claim 1, wherein the thermal transfer device includes plates arranged in a stacked arrangement, the plates forming the fins.

7. The pluggable module assembly of claim 6, wherein the plates have variable heights such that the upper thermal interface is non-planar.

8. A pluggable module assembly comprising:

a housing having a top wall, a bottom wall and sidewalls between the top wall and the bottom wall, the housing forming a cavity holding a module circuit board therein, the module circuit board having an electrical component mounted to a surface of the module circuit board, the top wall having an opening above the cavity aligned with the electrical component mounted to the module circuit board; and a thermal transfer device separate and discrete from the housing, the thermal transfer device being received in the opening of the top wall and extending into the cavity of the housing into thermal communication with the electrical component mounted to the module circuit board, wherein the thermal transfer device transfers heat from the electrical component mounted to the module circuit board to an upper thermal interface, the thermal transfer device including fins separated by channels at the upper thermal interface such that the upper thermal interface is non-planar, wherein the upper thermal interface is positioned at or below the top wall of the housing, wherein the thermal transfer device includes an upper member defining the upper thermal interface and a lower member having a lower thermal interface configured to interface with the electrical component mounted to the module circuit board, the upper member being in thermal communication with the lower member and transferring heat from the lower member, and wherein the upper member includes a plurality of upper plates arranged in a stacked arrangement, the upper plates forming the fins, the lower member including a plurality of lower plates arranged in a stacked arrangement, the upper plates and the lower plates being interleaved at a thermal transfer device interface.

9. The pluggable module assembly of claim 8, wherein the housing defines an envelope characterized by a height of the housing between the top wall and the bottom wall and a width of the housing between the sidewalls, wherein the thermal transfer device is contained within the envelope and does not extend beyond the height or the width of the housing.

10. The pluggable module assembly of claim 8, wherein the fins include side surfaces and end edges, the side surfaces facing the channels, the channels configured to receive fins of an external heat sink and the fins of the thermal transfer device are configured to be located between corresponding fins of the external heat sink such that the side surfaces are in thermal communication with the fins of the external heat sink.

11. The pluggable module assembly of claim 8, wherein the housing includes an upper shell and a lower shell, the upper shell defining the top wall, the lower shell defining the bottom wall, the electrical component mounted to the module circuit board being held between the upper shell and the lower shell, the thermal transfer device being received in and held by the upper shell.

12. The pluggable module assembly of claim 8, wherein the thermal transfer device includes plates arranged in a stacked arrangement, the plates forming the fins.

13. The pluggable module assembly of claim 12, wherein the plates have variable heights such that the upper thermal interface is non-planar.

14. A pluggable module assembly comprising:

a housing having a top wall, a bottom wall and sidewalls between the top wall and the bottom wall, the housing forming a cavity holding a module circuit board therein, the module circuit board having an electrical component mounted to a surface of the module circuit board, the top wall having an opening above the cavity aligned with the electrical component mounted to the module circuit board; and a thermal transfer device separate and discrete from the housing, the thermal transfer device being received in the opening of the top wall and extending into the cavity of the housing into thermal communication with the electrical component mounted to the module circuit board, the thermal transfer device including an upper member defining an upper thermal interface and a lower member having a lower thermal interface configured to interface with the electrical component mounted to the module circuit board, the upper member being in thermal communication with the lower member and transferring heat from the lower member, wherein the upper member includes a plurality of upper plates arranged in a stacked arrangement, the lower member including a plurality of lower plates arranged in a stacked arrangement, the upper plates and the lower plates being interleaved at a thermal transfer interface.

15. The pluggable module assembly of claim 14, wherein the housing defines an envelope characterized by a height of the housing between the top wall and the bottom wall and a width of the housing between the sidewalls, wherein the thermal transfer device is contained within the envelope and does not extend beyond the height or the width of the housing.

16. The pluggable module assembly of claim 14, wherein the thermal transfer device including fins separated by channels at the upper thermal interface such that the upper thermal interface is non-planar.

17. The pluggable module assembly of claim 16, wherein the fins include side surfaces and end edges, the side surfaces facing the channels, the channels configured to receive fins of an external heat sink and the fins of the thermal transfer device are configured to be located between corresponding fins of the external heat sink such that the side surfaces are in thermal communication with the fins of the external heat sink.

* * * * *